US008549451B2

(12) United States Patent
Koizumi et al.

(10) Patent No.: US 8,549,451 B2
(45) Date of Patent: Oct. 1, 2013

(54) VERIFICATION APPARATUS

(75) Inventors: Ryoji Koizumi, Yokohama (JP); Yusuke Tanefusa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 56 days.

(21) Appl. No.: 12/715,562

(22) Filed: Mar. 2, 2010

(65) Prior Publication Data

US 2010/0235796 A1    Sep. 16, 2010

(30) Foreign Application Priority Data

Mar. 16, 2009   (JP) .................................. 2009-063410

(51) Int. Cl.
*G06F 17/50*   (2006.01)

(52) U.S. Cl.
USPC .......................................................... 716/110

(58) Field of Classification Search
USPC .................................................. 716/100, 110
See application file for complete search history.

(56) References Cited

U.S. PATENT DOCUMENTS

| 8,004,087 | B2 * | 8/2011 | Amano et al. | 257/762 |
|---|---|---|---|---|
| 2003/0226121 | A1 * | 12/2003 | Yokogawa | 716/1 |
| 2005/0093163 | A1 * | 5/2005 | Ho et al. | 257/762 |
| 2005/0095751 | A1 * | 5/2005 | Hau-Riege et al. | 438/118 |
| 2007/0155160 | A1 * | 7/2007 | Allman et al. | 438/620 |
| 2007/0259518 | A1 * | 11/2007 | Allman et al. | 438/622 |
| 2008/0132065 | A1 * | 6/2008 | Allman et al. | 438/667 |
| 2008/0209367 | A1 | 8/2008 | Kiyohito | |
| 2008/0209384 | A1 | 8/2008 | Ohtsuka | |
| 2009/0026622 | A1 * | 1/2009 | Amano et al. | 257/762 |
| 2010/0031092 | A1 * | 2/2010 | Dokken et al. | 714/45 |
| 2012/0048602 | A1 * | 3/2012 | Lee et al. | 174/257 |
| 2012/0119366 | A1 * | 5/2012 | Li et al. | 257/751 |

FOREIGN PATENT DOCUMENTS

| JP | 2007-088178 A | 4/2007 |
|---|---|---|
| JP | 2007-305794 A | 11/2007 |
| JP | 2007-329361 A | 12/2007 |
| JP | 2008-210131 A | 9/2008 |
| JP | 2008-210983 A | 9/2008 |

OTHER PUBLICATIONS

Notification of Reasons for Refusal issued Nov. 13, 2012, in counterpart Japanese Patent Application No. 2009-063410 (5 pages including partial English translation).

* cited by examiner

*Primary Examiner* — Suchin Parihar
(74) *Attorney, Agent, or Firm* — Arent Fox LLP

(57) ABSTRACT

A design verification apparatus for a semiconductor device includes: a storage for storing layout information of the semiconductor device, the layout information including information of interconnection regions and a via regions; and a controller for dividing the interconnection regions into wire regions and cross regions, the cross regions corresponding to the via regions, respectively, the wire regions extending between the cross regions, respectively, and extracting at least one of the wire regions as a candidate having a potential risk of future disconnection defect on the basis of the length of the wire regions.

8 Claims, 22 Drawing Sheets

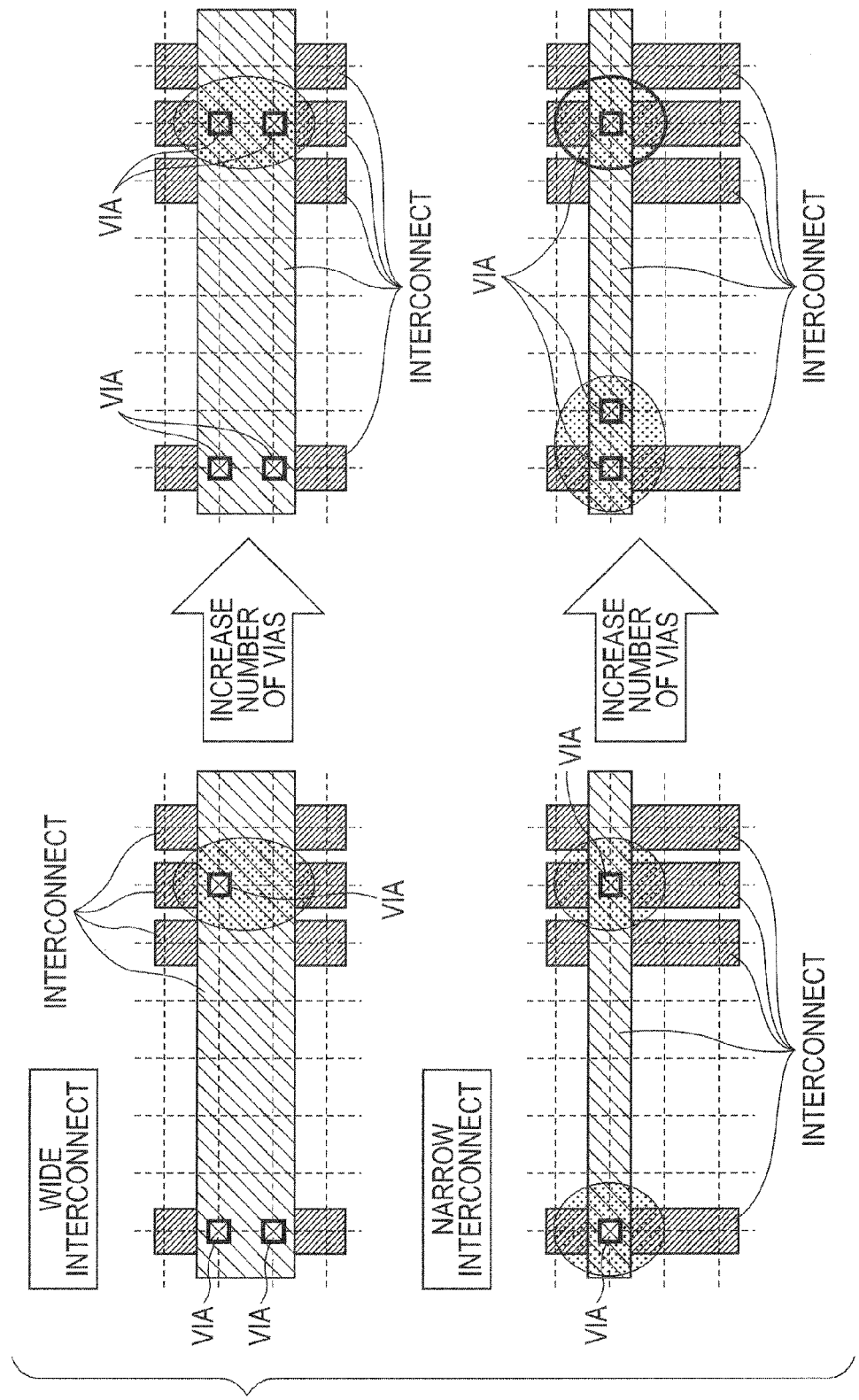

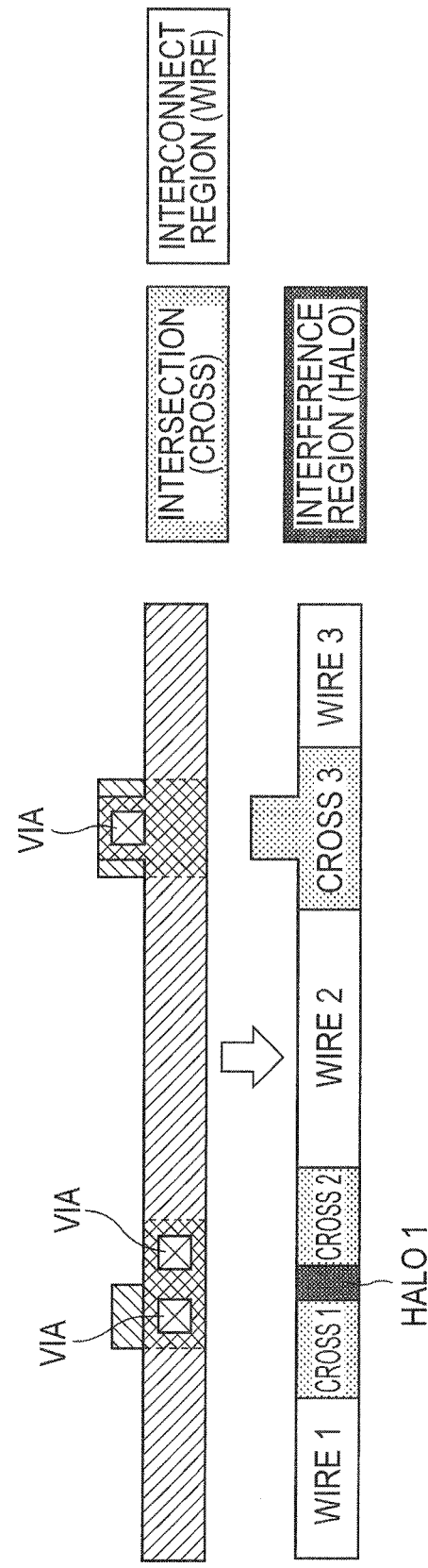

VERIFICATION APPARATUS

CROSS-REFERENCE TO RELATED APPLICATION

This application is based upon and claims the benefit of priority of the prior Japanese Patent Application No. 2009-063410 filed on Mar. 16, 2009, the entire contents of which are incorporated herein by reference.

FIELD

The embodiments discussed herein are related to a design verification apparatus for a semiconductor device.

BACKGROUND

In manufacturing semiconductor devices, there is known a phenomenon that a disconnection defect is caused in a connection via in interconnects formed in a semiconductor device due to stress migration. To prevent such a defect, therefore, for example, a plurality of vias are arranged (increase in the number of vias or vias arrangement) in a portion for connection between an upper interconnect and a lower interconnect in a substrate, alternatively, a dummy via is disposed (dummy via insertion) in an interconnect. Stress migration is a phenomenon that bubbles, each called "vacancy", generated in a metal interconnect migrate due to the gradient of a stress caused in the interconnect. These vacancies migrate to be concentrated into a via, so that a space called "void" is increased in size. The increased space causes a disconnection defect.

SUMMARY

According to an aspect of the embodiment, a design verification apparatus for a semiconductor device including: a storage for storing layout information of the semiconductor device, the layout information including information of interconnection regions and a via regions; and a controller for dividing the interconnection regions into wire regions and cross regions, the cross regions corresponding to the via regions, respectively, the wire regions extending between the cross regions, respectively, and extracting at least one of the wire regions as a candidate having a potential risk of future disconnection defect on the basis of the length of the wire regions.

The object and advantages of the embodiment will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a diagram explaining a related art;
FIG. 6 is a diagram explaining an embodiment.

DESCRIPTION OF EMBODIMENTS

FIGS. 1 to 5D are diagrams explaining a related art.
To verify whether a disconnection defect occurs, the following countermeasures have been performed device in the related art.
(a) When the width of an interconnect is equal to or larger than a predetermined value, a plurality of vias are arranged.
(b) When the width of an interconnect is equal to or smaller than the predetermined value and the ratio of the total area of the interconnect to the number of arranged vias is equal to or larger than a predetermined value, the number of arranged vias is increased by arranging a plurality of vias or inserting a dummy via.

According to the countermeasure (a), the interconnect has a width enough to arrange a plurality of vias. So long as a portion where vias have to be arranged can be specified, the arrangement can be easily achieved (namely, vias can be arranged so that the vias occupy any other interconnect track).

According to the countermeasure (b), it is important that the interval between adjoining vias is kept so as to be equal to or smaller than a predetermined value and a stress applied to each via is suppressed to a predetermined value or smaller. In the related art, if an interconnect branches, it is difficult to accurately obtain the interval between adjoining vias. Accordingly, a reference in which the ratio of the area of a target interconnect and the number of vias arranged in the interconnect should be equal to or smaller than the predetermined value is used.

In the countermeasure (b), even when the number of vias to be arranged in an interconnect is simply determined on the basis of the ratio of the total area of the interconnect to the number of vias, the positions of arranged vias and surrounding circumstances are not taken into consideration (even the uneven arrangement of vias is OK). Unfortunately, a disconnection defect may occur in a portion where the interval of adjoining vias has a very large value in an actual semiconductor device.

Referring to FIG. 1, when an interconnect has a wide width, a plurality of vias can be arranged so as to be close to each other because the interconnect has a width enough to arrange vias in the widthwise direction. Whereas, when the width of an interconnect is narrow, it should be devised to arrange vias, since the interconnect does not have a width enough to arrange vias in the widthwise direction. In some cases, it is difficult to achieve vias arrangement.

Figure 2A:
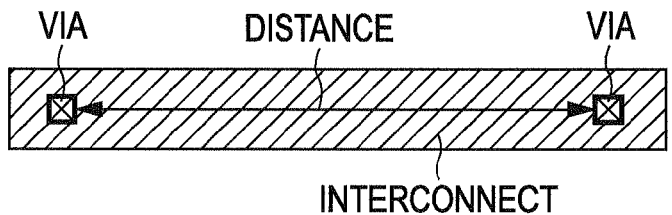
FIGS. 2A to 2D are diagrams explaining the related art.
Figure 2B:
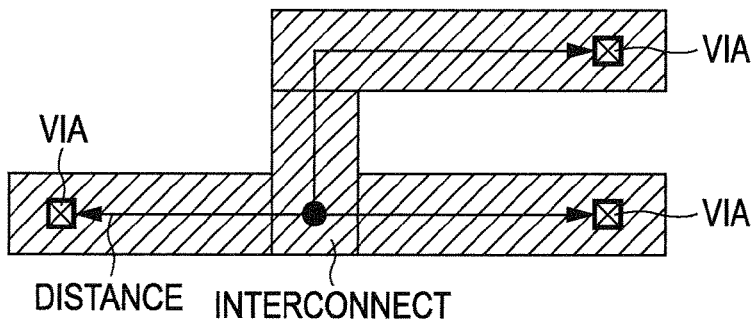
Figure 2C:
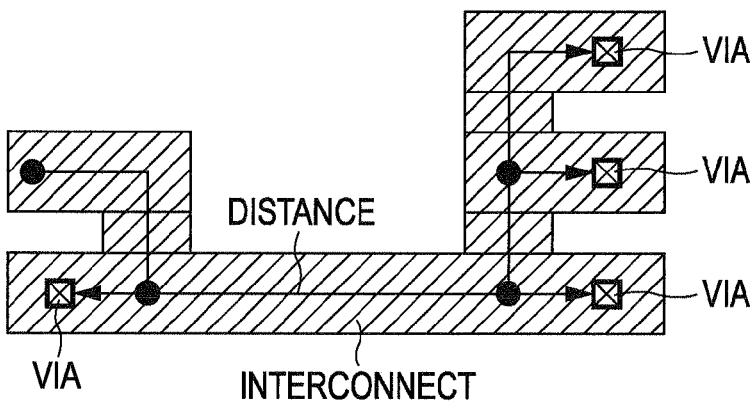
Figure 2D:
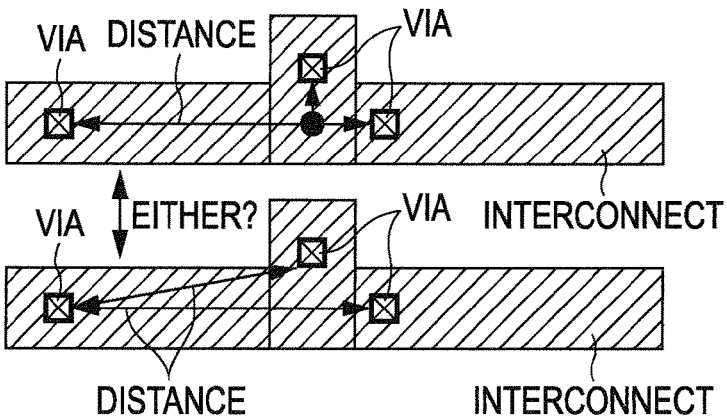

Referring to FIGS. 2A to 2D, if an interconnect has a simple linear shape as shown in FIG. 2A, it is easy to obtain the interval of vias or the area of the interconnect. It is therefore easy to know where a dummy via should be disposed. Whereas, when an interconnect branches as shown in FIGS. 2B to 2D, it is difficult to estimate a stress applied on each via caused in the interconnect. In order to accurately know a state of the stress, a stress simulation has to be performed. The stress simulation requires a large amount of calculations using complicated expressions. Accordingly, the cost of calculating is expensive. Therefore, it is unrealistic that the stress simulation is performed with respect to most parts of a semiconductor device or a very large area in the device. The stress simulation has to be performed with respect only to a target portion to be addressed. For estimation of a portion where a dummy via should be disposed, since vias are arranged over the whole of a semiconductor device, it is necessary to estimate portions over a very large area of the semiconductor device. Accordingly, it is difficult to perform stress simulations.

In order to prevent the occurrence of a disconnection defect in an actual semiconductor device, a reference value (ratio) in the countermeasure (b) may be strictly set, thus resulting in an excess via margin. Unfortunately, this may lead to a reduction in flexibility of designing interconnection caused by vias arrangement or an increase in capacitance of an interconnect caused by inserting too many dummy vias.

Figure 3:
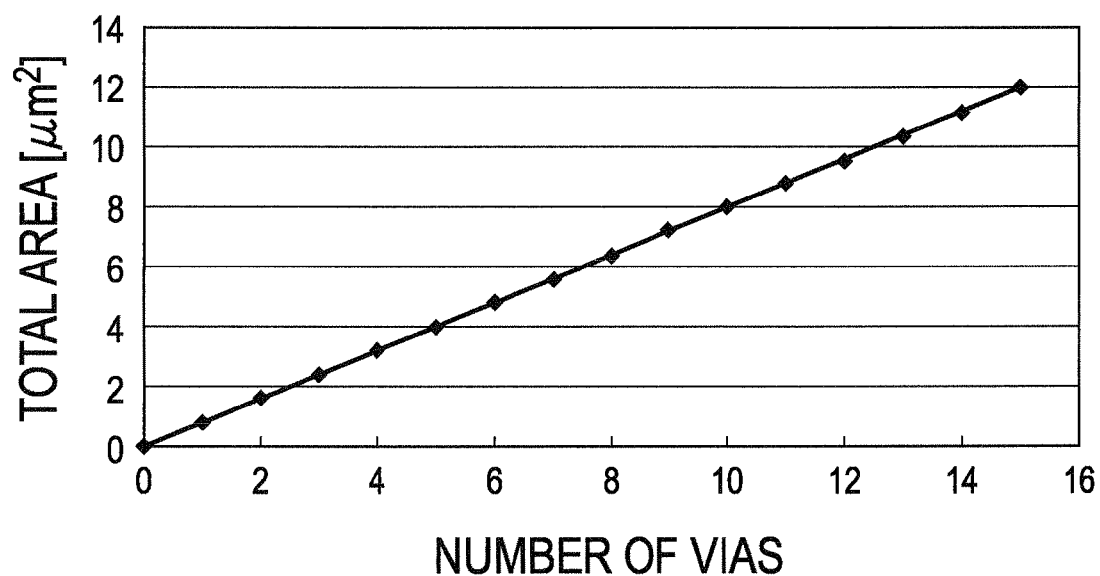
FIG. 3 is a diagram explaining the related art.

FIG. 3 is a graph showing references each indicated by the ratio of the area of a target interconnect to the number of vias arranged in the interconnect. Referring to FIG. 3, if (the area of the interconnect)/(the number of vias)>0.8 [$\mu m^2$/vias], an error will result. It is necessary to additionally dispose a via.

Figure 4:
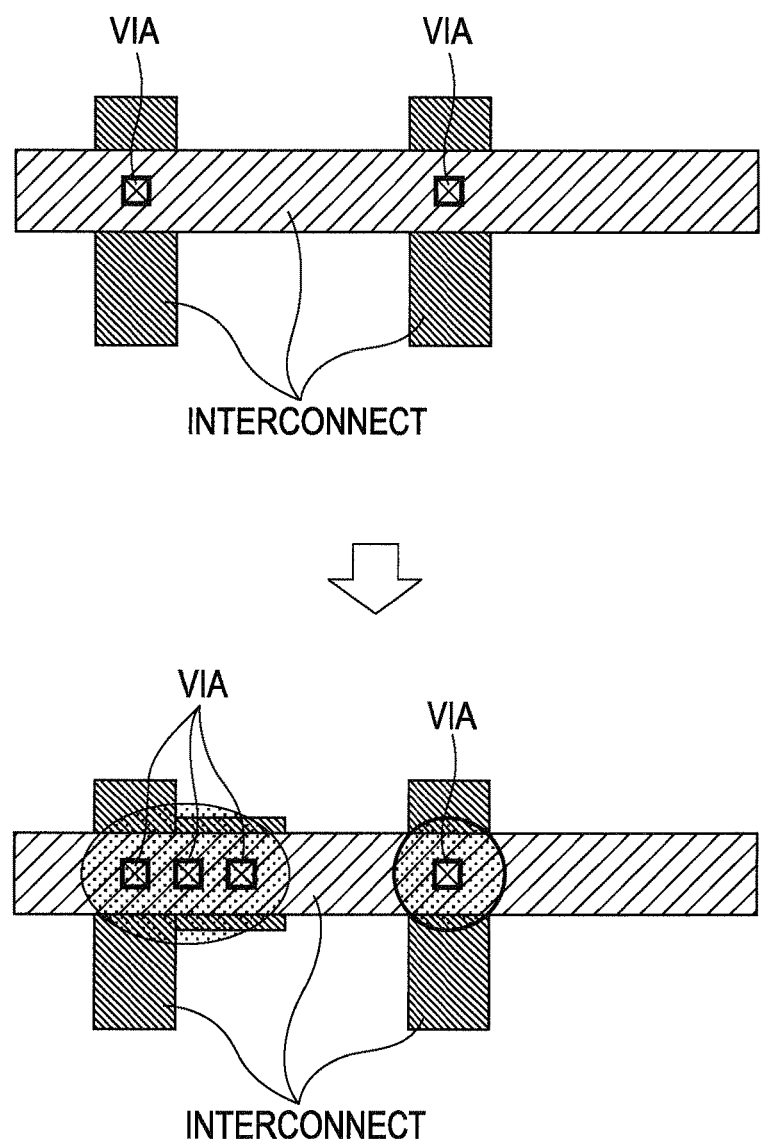
FIG. 4 is a diagram explaining the related art.

FIG. 4 is a diagram explaining a problem of excess vias. Referring to upper part of FIG. 4, if the area of an interconnect is 3 $\mu m^2$, the number of necessary vias is four or more, as shown in the graph of FIG. 3. However, there is no reference showing how to arrange vias. Even when three vias are arranged on the left of the interconnect and one via is disposed on the right thereof, as shown in lower part of FIG. 4, there is no problem upon verification. In actual, however, the three vias on the left are too many and the one via on the right is too few. Consequently, a disconnection defect may easily occur in a portion where the right via is placed.

Figure 5A:
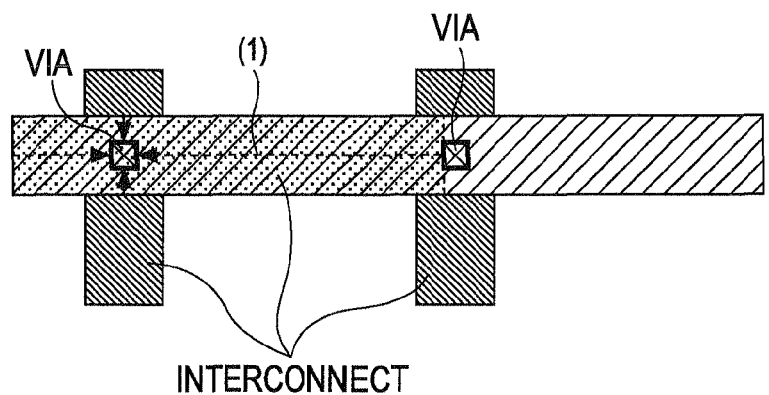
FIGS. 5A to 5D are diagrams explaining the related art.
Figure 5B:
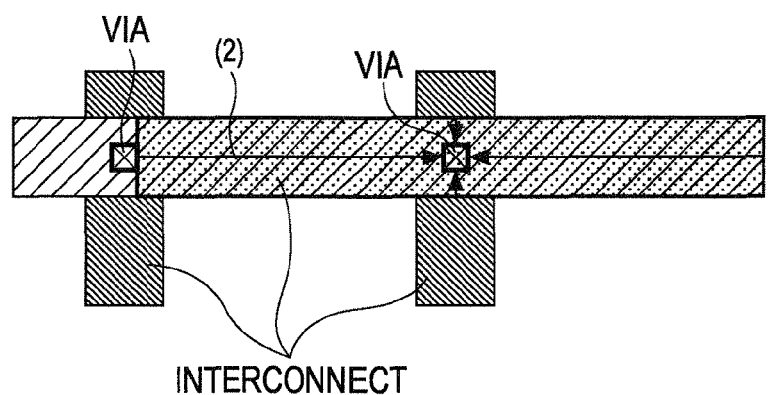
Figure 5C:
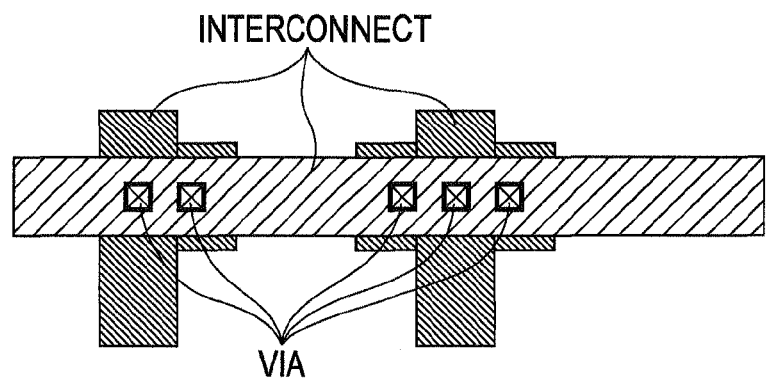
Figure 5D:
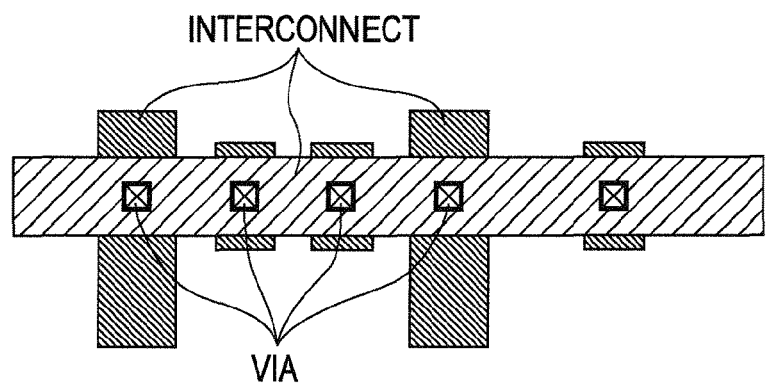
Figure 7:
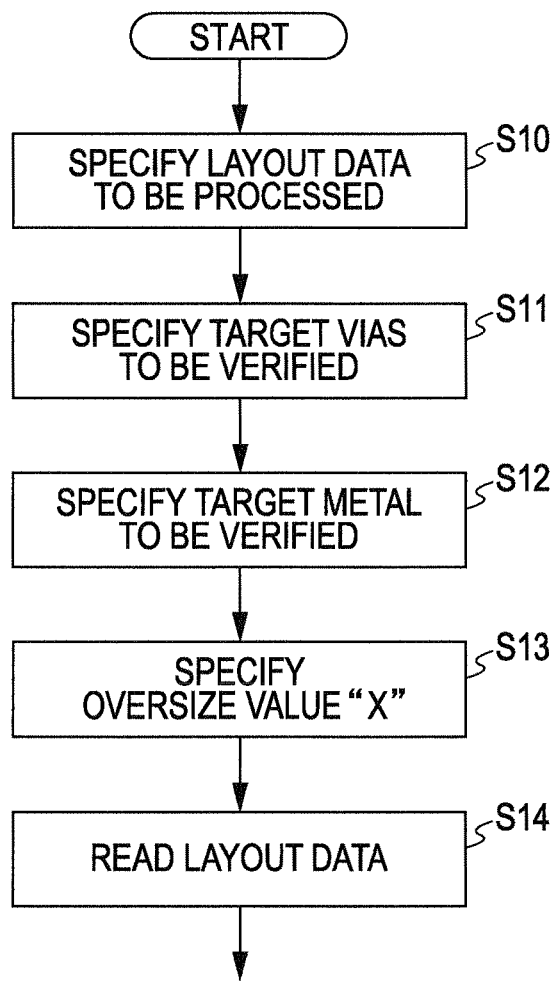
FIG. 7 illustrates first part of a flowchart according to the embodiment.
Figure 8:
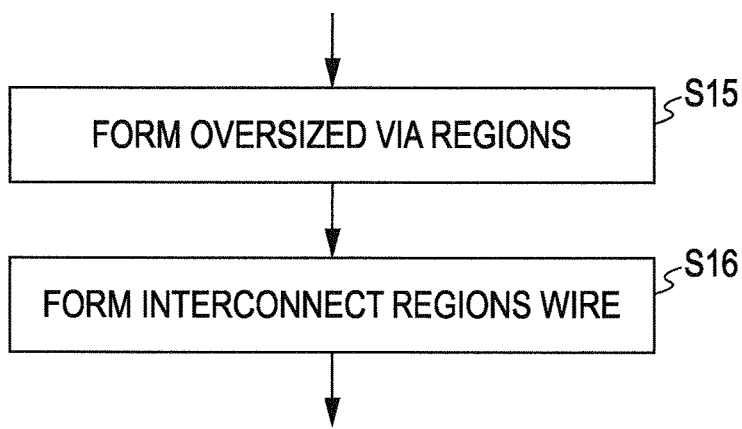
FIG. 8 illustrates second part of the flowchart according to the embodiment.
Figure 9:
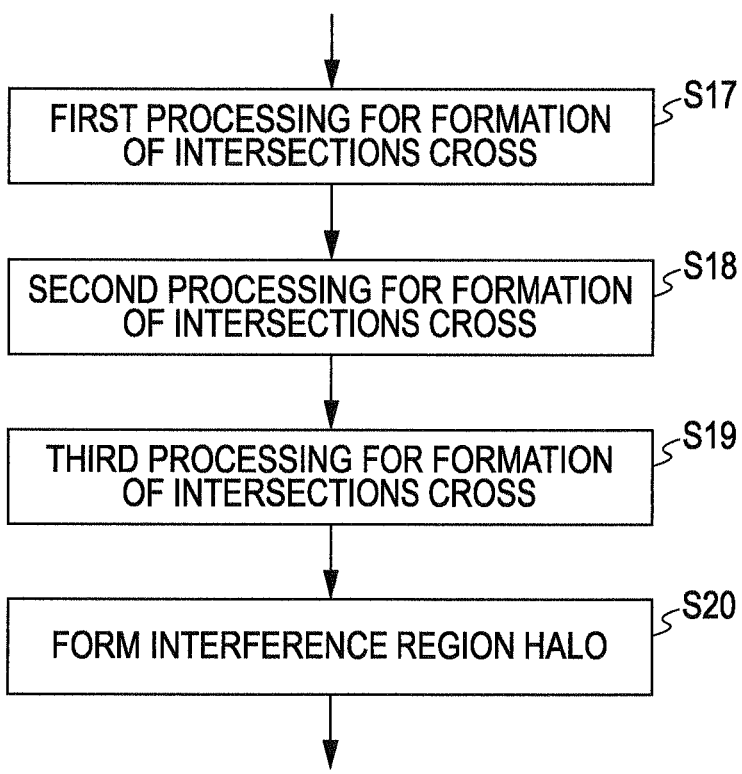
FIG. 9 illustrates third part of the flowchart according to the embodiment.

Referring to FIGS. 5A to 5D, stress migration depends on the distance between a target via and the adjoining via (the area of an interconnect). Assuming that the area of an interconnect (1) in FIG. 5A is 1.5 $\mu m^2$ and the area of an interconnect (2) in FIG. 5B is 2.4 $\mu m^2$, therefore, the number of necessary vias for the interconnect (1) on the left is two and that for the interconnect (2) on the right is three, as shown in the graph of FIG. 3. FIG. 5C illustrates the above-described arrangement of vias. Alternatively, a dummy via can be inserted so that the distance between adjoining vias (the area of an interconnect) is smaller than a predetermined value (see FIG. 5D).

An embodiment of the present invention provides a design verification apparatus that obtains information for optimum arrangement of interconnection vias of a semiconductor device. Specifically, the apparatus is configured to compare each of the area of a region where an interconnection via is extended (up to, for example, the sides of an interconnect in the widthwise direction thereof), the area of an interconnection region adjoining to the above region, and if there is a via adjoining to the above interconnection via, the area of an interconnection region between the interconnection via and the adjoining via with a predetermined reference value and is configured to, when the number of vias is too many or too few, display a portion with many or few vias.

In the other words, the apparatus stores layout information of the semiconductor device, the layout information including information of interconnection regions and via regions; divides the interconnection regions into wire regions and cross regions, the cross regions corresponding to the via regions, respectively, the wire regions extending between the cross regions, respectively; and extracts at least one of the wire regions as a candidate having a potential risk of future disconnection defect on the basis of the length of the wire regions.

Thus, the apparatus notifies a designer of a portion where stress-migration resistance has to be improved to verify the design of arrangement of vias so that a countermeasure can be taken.

FIG. 6 is a diagram explaining the embodiment of the present invention.

Interconnection is divided in two steps (to set an interference region) on the basis of interconnection design information, thus allowing the segmentation of the interconnection and calculation of the area of each via. An interference region has the following functions.

(1) Interconnection can be divided in consideration of the influence of a stress.
(2) In arrangement of a plurality of vias in a predetermined region, which interconnect causes a stress and which via is exerted by the stress caused in the interconnect can be defined. The interference region is formed by increasing the area of a via (i.e., oversizing the via). An oversize value at that time is used as a parameter so that the degree of interconnection division in (1) can be controlled.

FIG. 6 is a conceptual diagram of an operation in accordance with the present embodiment. FIG. 6 illustrates a way of overlapping via information items and interconnection information items by rewriting information indicating a via having an original size in upper part of FIG. 6 so that the via covers a larger region. An interconnection region covered with an oversized via is termed a region (or intersection) CROSS where the via and an interconnect intersect. A segment where a distance from the via in the region CROSS is equal to or larger than a predetermined value is termed a region HALO. When a plurality of vias are arranged, the region HALO serves as an interference region where the influences of the vias interfere with each other. Another segment is called an interconnect region WIRE that serves as an interconnect segment away from the via.

FIGS. 7 to 11 illustrate a flowchart in accordance with the present embodiment.

First, in step S10, layout data to be processed is specified. This means that a portion to be verified with respect to the arrangement of vias is specified in the design of a semiconductor device on a CAD system. In step S11, target vias to be verified are specified. Specifically, since the semiconductor device is designed so as to include multilayered interconnection, one via layer to be processed is specified. In step S12, a target metal to be verified is specified. The "metal" means an interconnect made of metal. Which interconnect of interconnects layered in the semiconductor device is specified as a target to be verified. As for specifying, a metal layer overlying or underlying the target vias is specified. In step S13, an oversize value, indicated by "X", for the vias is specified. In order to rewrite information indicating each via into information indicating an oversized or enlarged via, the size of the enlarged via is specified. Specifically, the size is specified.

Steps S10 to S13 provide information items for directions about a process. A file including those information items can be created as a control file and be externally supplied to the apparatus. Accordingly, the order of steps S10 to S13 is not limited to the order shown in FIG. 7.

In step S14, layout data is read. The layout data corresponds to physical layout data in the format of, for example, GDSII, OASIS, DEF, OpenAccess, or MEBES. The layout data includes information of interconnection regions and via regions. In step S15, virtually enlarged via regions are formed. Specifically, regions each where one of the vias specified in step S11 is oversized by the value X specified in step S13 are formed in the metal specified in step S12. In step S16, interconnect regions WIRE are formed. Specifically, the oversized via region formed in step S15 are removed (subjected to the logic operation NOT) from the metal specified in step S12 to form regions which are defined as interconnect regions WIRE.

Steps S17 to S19 are processing steps of forming intersections CROSS. In step S17, edges shared by the metal in step S12 and each oversized via region in step S15 are extracted from the oversized via region to extract regions each where the distance between the shared edge and an internal segment (in a range indicating the original via) of the corresponding via specified in step S11 is equal to or smaller than the value X specified in step S13. In step S18, non-shared edges which are not shared by the metal in step S12 and each oversized via region in step S15 are extracted from the oversized via region to extract regions each where the distance between the non-shared edge and an internal segment is equal to or smaller than the value X specified in step S13. The internal segment is included in an internal region including the non-shared edge and a region obtained by combining (performing the logic operation OR on) the corresponding via specified in step S11 and the regions extracted in step S17. In step S19, the vias specified in step S11, the extracted regions in step S17, and the regions extracted in step S18 are combined (subjected to the logic operation OR) to form regions which are defined as intersections CROSS. Thus, the design verification apparatus decides borders of the WIRE regions and the CROSS regions, the borders being made by virtually enlarged via regions.

In step S20, each intersection CROSS obtained in step S19 is removed (subjected to the logic operation NOT) from the corresponding oversized via region in step S15 to form a region which is defined as an interference region HALO.

In step S21, n is set to 1 (n=1). In step S22, an n-th intersection, indicated by CROSS {n}, is extracted. In step S23, a region WIRE and a region HALO connected to the intersection CROSS {n} are extracted. In step S24, whether there is a breach of a design rule is determined. Specifically, in step S24, assuming that Y indicates a maximum area of an interconnect connectable to one via, when the total area=(the area of a region CROSS)+(the area of all of connected regions WIRE)+(the area of all of connected regions HALO) is larger than Y (the total area>Y), it is determined that there is a breach of the design rule. Generally, width of the region WIRE is uniform. Thus, it is determined on the basis of total length of the regions WIRE that there is a breach of the design rule.

If it is determined in step S24 that there is no breach of the design rule, the process proceeds to step S26. Whereas, if it is determined in step S24 that there is a breach of the design rule, an error report is output in step S25. Then, the process proceeds to step S26. Examples of the error report may include information indicating the coordinates of the erroneous region CROSS, information indicating the coordinates of the via included in the erroneous region CROSS, a value of the erroneous total area, information indicating the coordinates of the region WIRE connected to the region CROSS, and information indicating the coordinates of the region HALO connected to the region CROSS. The error report is generated for each region CROSS determined as an error. Results of error determinations may be combined into one file so as to be output as the file. The error report may be displayed so as to be visually confirmed on layout data through a graphical user interface (GUI). In step S26, n is set to (n+1) (n=n+1). In step S27, whether n is equal to or larger than the total number, indicated by m, of regions CROSS is determined. If NO in step S27, the process returns to step S22. If YES, the process is terminated.

Although one via layer to be processed is specified in the above description, a plurality of via layers can also be specified. In this case, the processing steps S15 to S27 can be performed for each via layer.

The area of an interconnect can be calculated in consideration of any of the following items:
  only the metal, serving as an upper layer overlying the vias;
  only the metal, serving as a lower layer underlying the vias; and
  both of the upper and lower metal layers on the vias.

When both of the upper and lower metal layers are taken into consideration, the process can be achieved by changing the above-described flow as follows.
  In step S12, both of the upper and lower metal layers on the vias are selected.
  The processing steps S15 to S27 are performed on each of the upper and lower metal layers.
  In this case, determination in step S24 is not performed. An area value calculated for each intersection CROSS is given as an attribute of the via included in the intersection CROSS. Since area values calculated for the upper and lower interconnect layers of each via are given as attributes, the area values are added and determination in step S24 is then performed.

In the present embodiment, a metal layer is segmented into regions CROSS, WIRE, and HALO so that stress migration is easily analyzed. So long as an expression uses parameters related to the regions CROSS, WIRE, and HALO, another expression can be used for determination in step S24.

Figure 10:
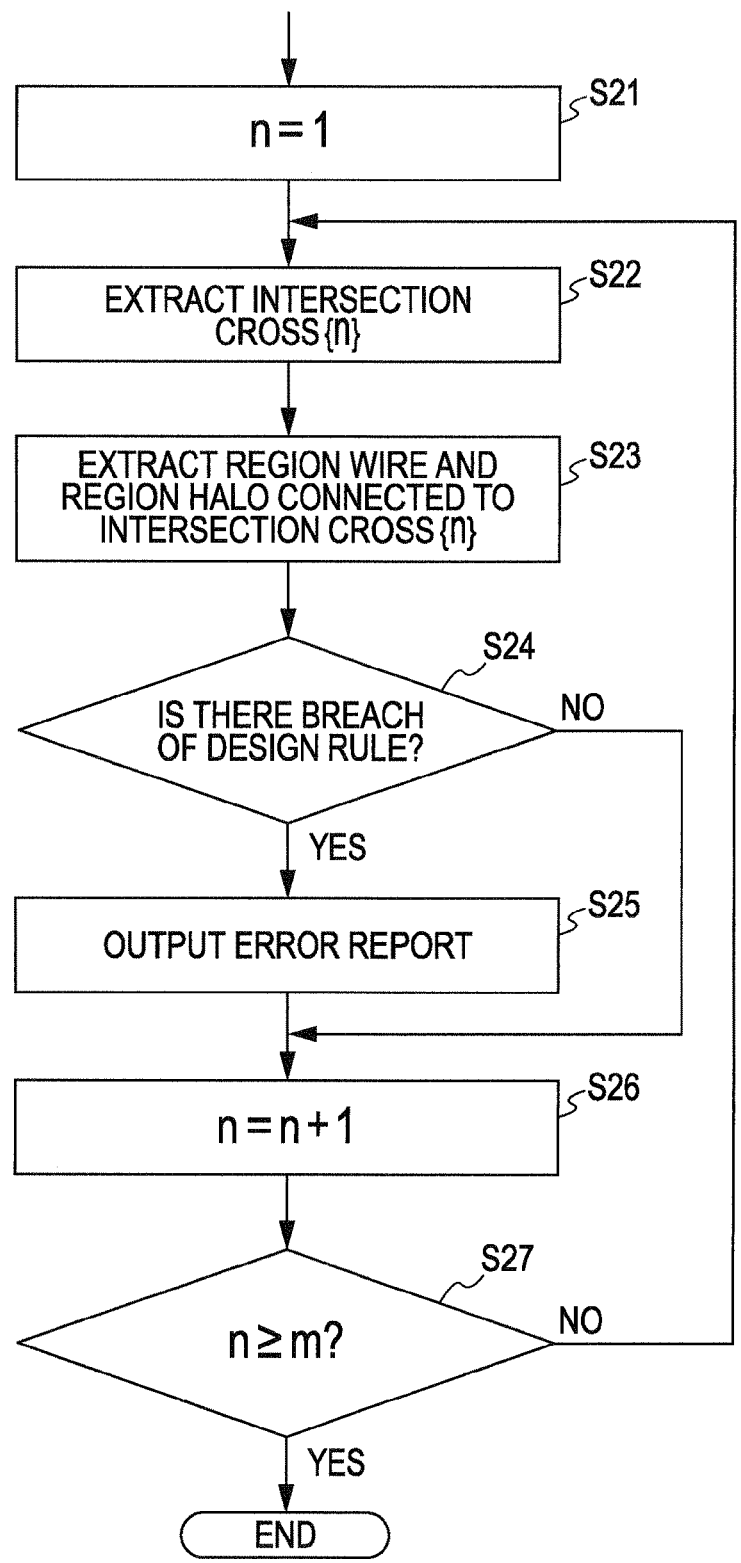
FIG. 10 illustrates fourth part of the flowchart according to the embodiment.
Figure 11:
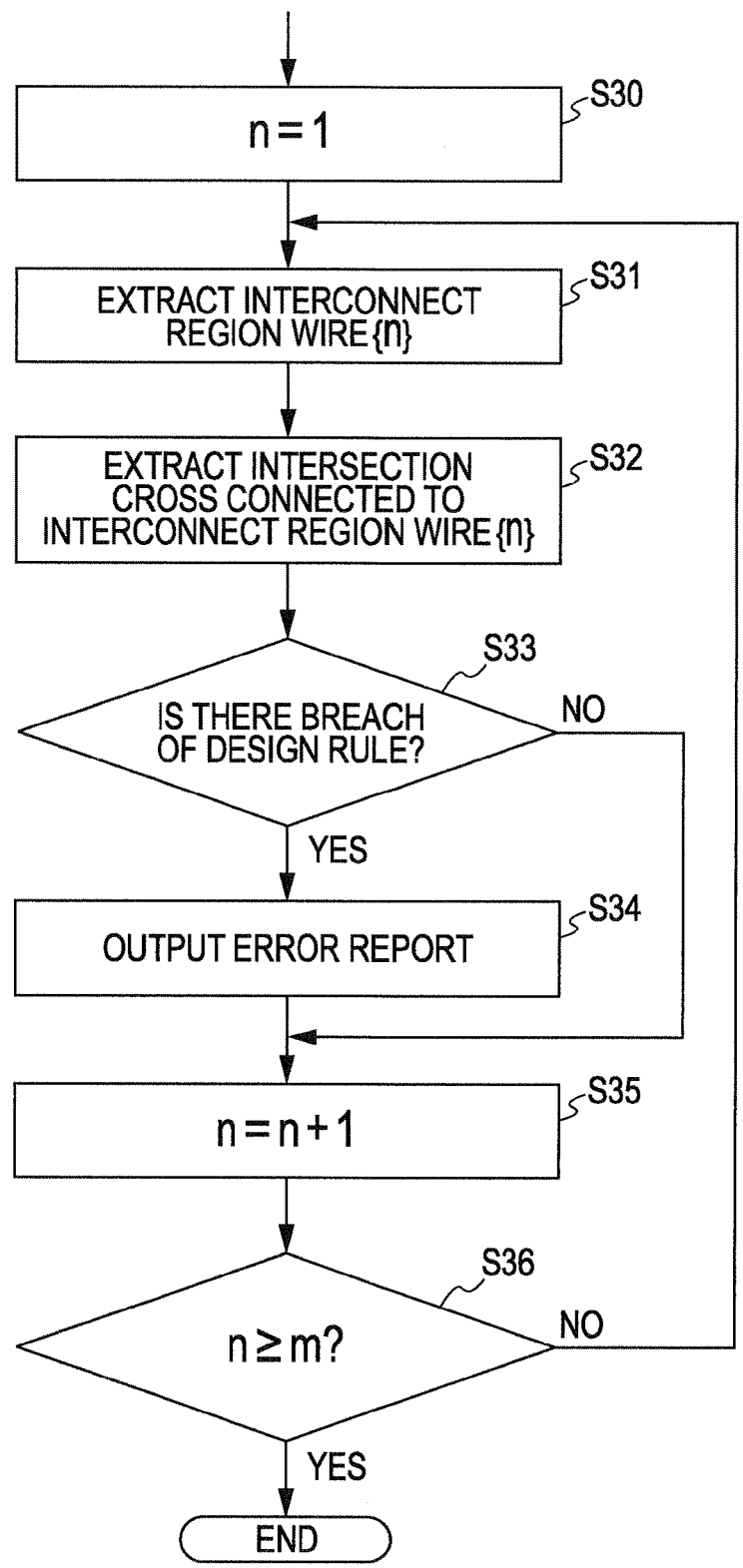
FIG. 11 illustrates part as a modification of the fourth part in FIG. 10.

FIG. 11 illustrates processing steps as a modification of step S21 and the subsequent steps in FIG. 10. In step S30, n is set to 1 (n=1). In step S31, an interconnect region WIRE {n} is extracted. In step S32, a region CROSS connected to the region WIRE {n} is extracted. In step S33, whether there is a breach of the design rule is determined. As for the determination with respect to a breach of the design rule in step S33, assuming that Z indicates the area of an interconnect that can be supported by one via, when (the area of the region WIRE {n})/(the number of regions CROSS)>Y, alternatively, when (the area of the region WIRE {n}+the area of all of regions CROSS)/(the number of regions CROSS)>Y, it is determined that there is a breach of the design rule. In the other words, the design verification apparatus extracts at least one of the regions WIRE as a candidate having a potential risk of future disconnection defect on the basis of the ratio of the area of the region WIRE to number of regions CROSS connected to the region WIRE.

If NO in step S33, the process proceeds to step S35. If YES in step S33, an error report is output in step S34. The process then proceeds to step S35. In step S35, n=n+1 is calculated. In step S36, determination is made as to whether n is equal to or larger than m indicating the total number of interconnect regions WIRE. If NO in step S36, the process returns to step S31. If YES, the process is terminated. The values X, Y, and Z may be appropriately determined by the designer.

As described above, the determination expression indicating the area of a metal connectable to one via can be replaced with another one (area (WIRE)/num (CROSS)>Z) indicating how many vias support the area of one region WIRE.

FIG. 12A to 12H are diagrams explaining formation of regions CROSS, WIRE, and HALO.

Figure 12:
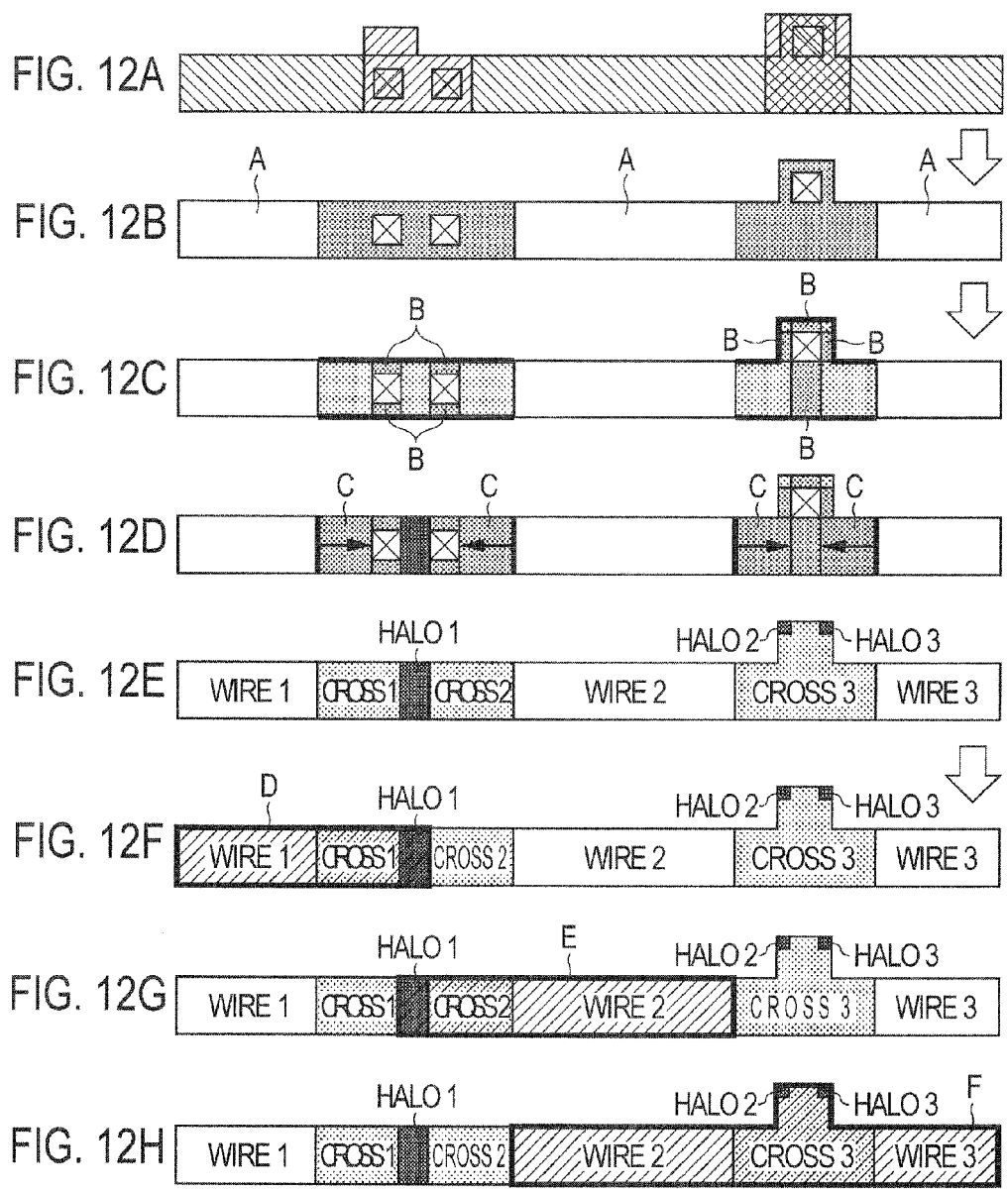
FIG. 12A to 12H are diagrams explaining formation of regions CROSS, WIRE, and HALO.

FIG. 12A illustrates that vias are oversized. Each region A shown in FIG. 12B is a region obtained by removing the oversized vias from a metal. Subsequently, a region where the distance between edges shared by each oversized region and the metal and the original via (included via) is equal to or smaller than an oversize value X is extracted. This region corresponds to each region B in FIG. 12C. In addition, a region where the distance between an inner edge of the metal and an included segment (internal segment) of each region B is equal to or smaller than the value X is extracted from each oversized via region. This region corresponds to each region C in FIG. 12D. The vias, the regions B, and the regions C are combined into intersections CROSS. The oversized via region excluding the intersections CROSS corresponds to a region HALO. In this manner, the metal, serving as an interconnect, is segmented into the regions WIRE, CROSS, and HALO, as shown in FIG. 12E. A region obtained by combining each region (intersection) CROSS with all of the regions HALO and WIRE connected to the intersection CROSS is an interconnect portion that effects a specific via. As shown in FIG. 12F, a region D is the region that effects an intersection CROSS 1. FIG. 12G illustrates a region E that effects an intersection CROSS 2. FIG. 12H illustrates a region F that effects an intersection CROSS 3. In some cases, there is no region HALO. In this case, the area of the region HALO may be set to zero.

Figure 13:
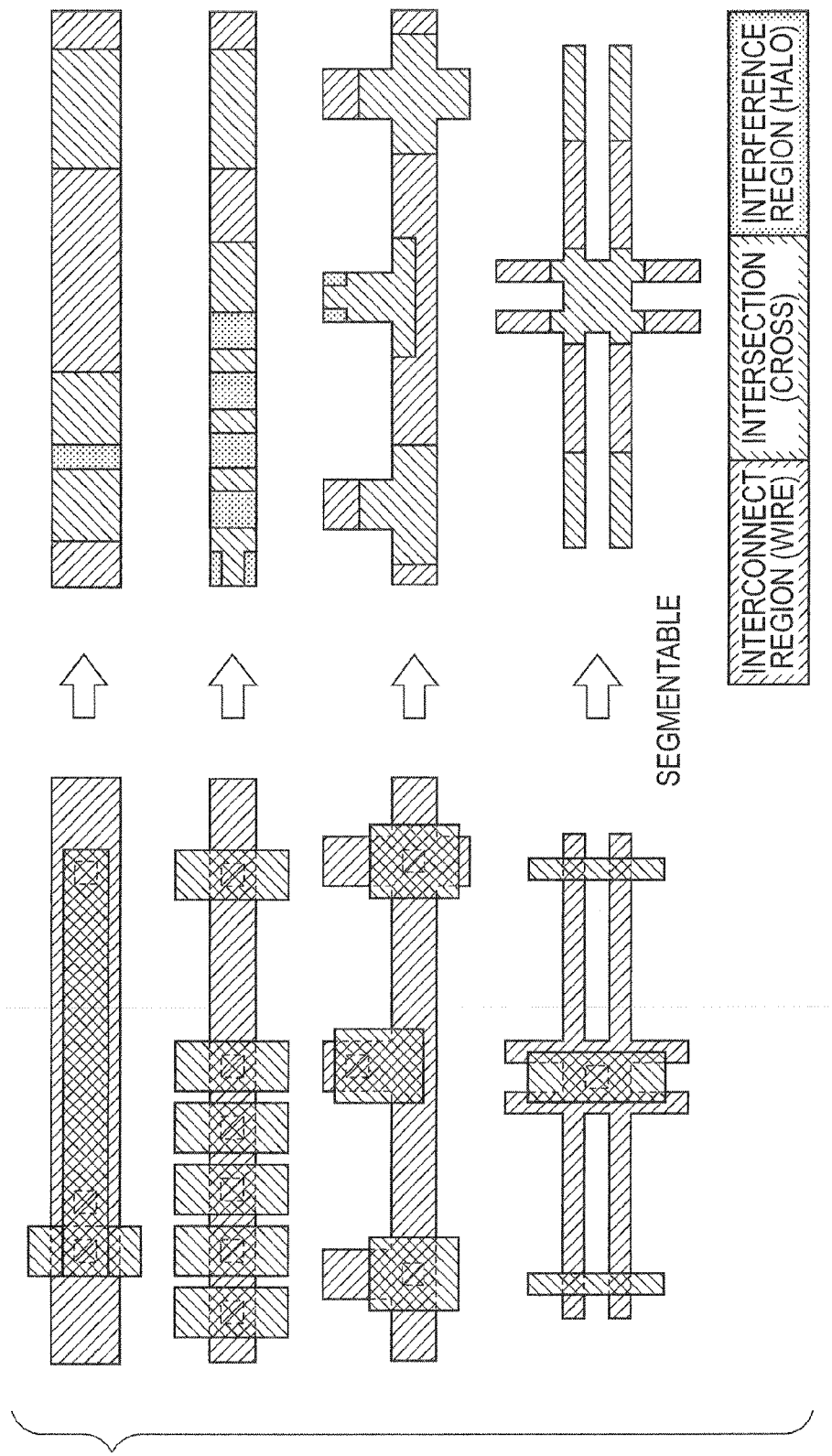
FIG. 13 is a diagram illustrating segmentations obtained using a method of segmenting an interconnection pattern as shown in FIGS. 12A to 12H.

FIG. 13 is a diagram illustrating segmentations obtained using a method of segmenting an interconnection pattern as shown in FIGS. 12A to 12H.

When interconnection patterns on the left of FIG. 13 are segmented using the above-described method, each of the interconnection patterns is segmented into regions WIRE, CROSS, and HALO. A region obtained by combining each intersection CROSS with regions HALO and WIRE connected to the intersection CROSS is a region that effects the intersection CROSS. When there is no region HALO, the area of the region HALO is set to zero.

FIGS. 14A to 14D and 15A and 15B are diagrams explaining setting of an oversize value.

Figure 14A:
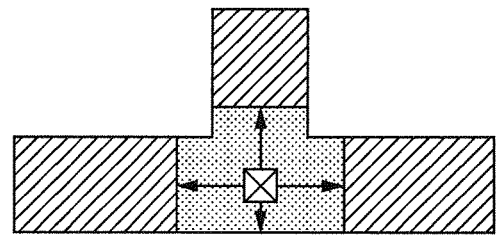
FIGS. 14A to 14D are diagrams explaining setting of an oversize value.
Figure 14B:
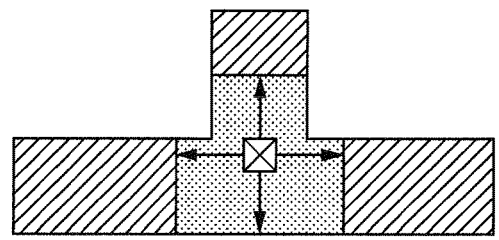
Figure 14C:
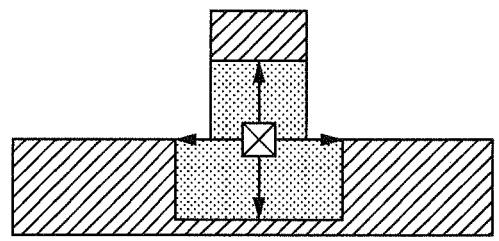
Figure 14D:
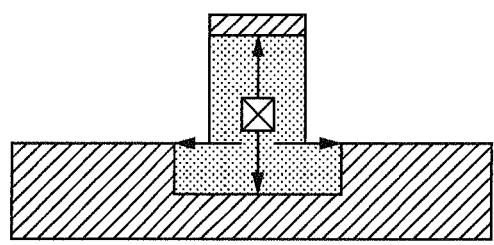

FIG. 14A illustrates a case where a via is positioned in the middle of an interconnect in the lateral direction. An oversize value is set so that regions WIRE are formed by segmentation. FIG. 14B illustrates a case where the position of a via is shifted upward as compared to the case of FIG. 14A. In this case, to segment an interconnect in a manner similar to the case in FIG. 14A, an oversize value has to be set so that a portion underlying the via is large. FIG. 14C illustrates a case where a via is further shifted upward as compared to the case of FIG. 14B. In this case, an interconnect region WIRE extending in the lateral direction is not segmented. In FIG. 14D, a via is located in a vertically extending portion of an interconnect. An interconnect region extending in the lateral direction is not segmented. In order to segment the laterally extending interconnect region, an oversize value has to be reset to a remarkably large value. As described above, in order to appropriately form interconnect regions WIRE by segmentation, it is important to set an oversize value. Accordingly, the following facts have to be taken into consideration for setting an oversize value.

An oversize value used for forming an interference region HALO is typically obtained by the following equation.

Oversize value=(a maximum width of a target interconnect)−(the size of a via)

When an oversize value is smaller than a value derived as mentioned above, an interconnect cannot be segmented in some cases, whereas an intersection CROSS and a region HALO can be set to small. If an oversize value is larger than a value obtained as mentioned above, an intersection CROSS can be easily formed (but so as to be too large), whereas the intersection CROSS and a region HALO are formed so as to have a large area, resulting in a reduction in size of an interconnect region WIRE.

Figure 15A:
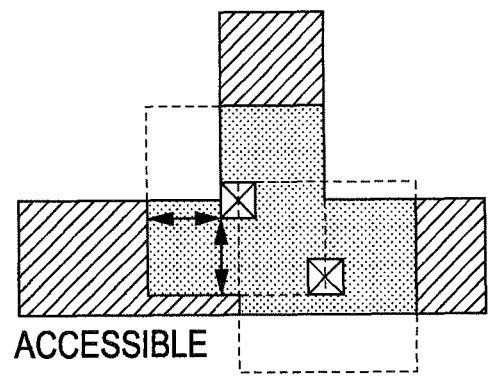
FIGS. 15A and 15B are diagrams explaining setting of an oversize value.
Figure 15B:
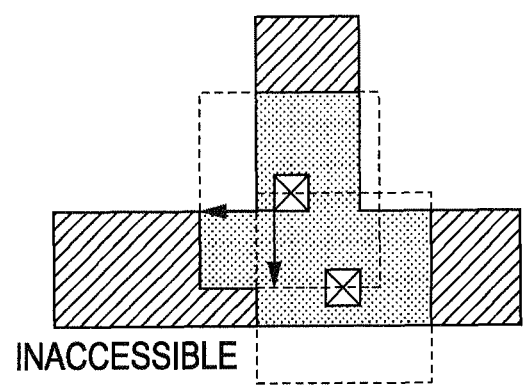

FIGS. 15A and 15B illustrate cases each where an interconnect portion extending laterally is to be processed. In FIG. 15A, an upper left via in the laterally extending interconnect portion is positioned outside an intersection CROSS for a lower right via. Accordingly, the upper left via can be processed (accessed) because the via is still connected to the laterally extending interconnect portion. In FIG. 15B, a longitudinally extending interconnect portion is partially covered with an intersection CROSS for a lower right via, so that an upper left via is disconnected from a laterally extending interconnect portion. Unfortunately, the upper left via is excluded from targets to be processed.

For processing when a plurality of vias are arranged near a branch of an interconnect, the following facts have to be taken into consideration. A via (intersection CROSS) on a target interconnect can be accessed. If the width of the interconnect is completely covered with a region formed by oversizing another via, the target via (intersection CROSS) cannot be accessed. An oversize value is determined in consideration of the above-described facts.

FIGS. 16A to 19 are diagrams illustrating that input layout data is processed.

Figure 16A:
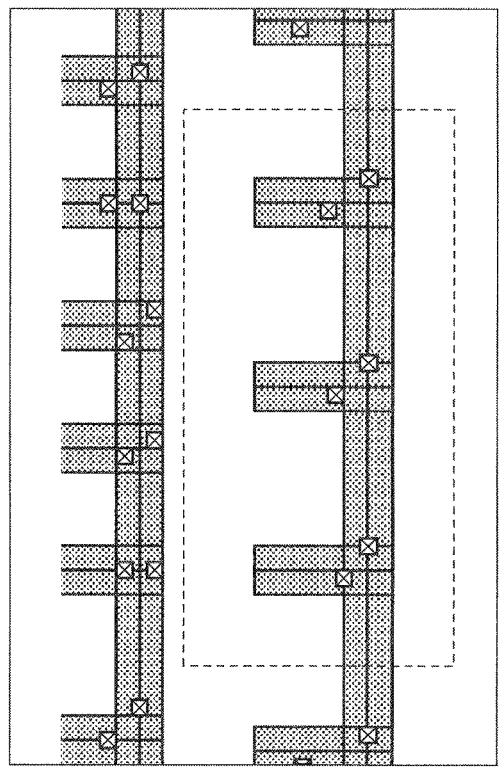
FIGS. 16A and 16B are diagrams illustrating input layout information to be processed.
Figure 16B:
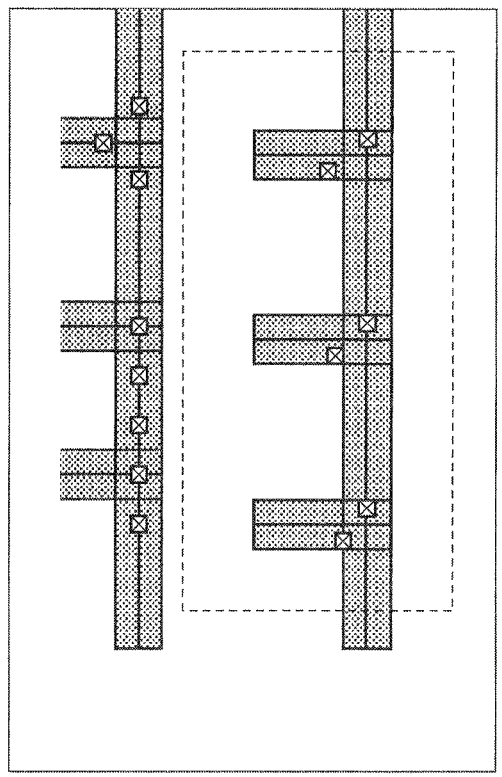
Figures 17A, 17B:
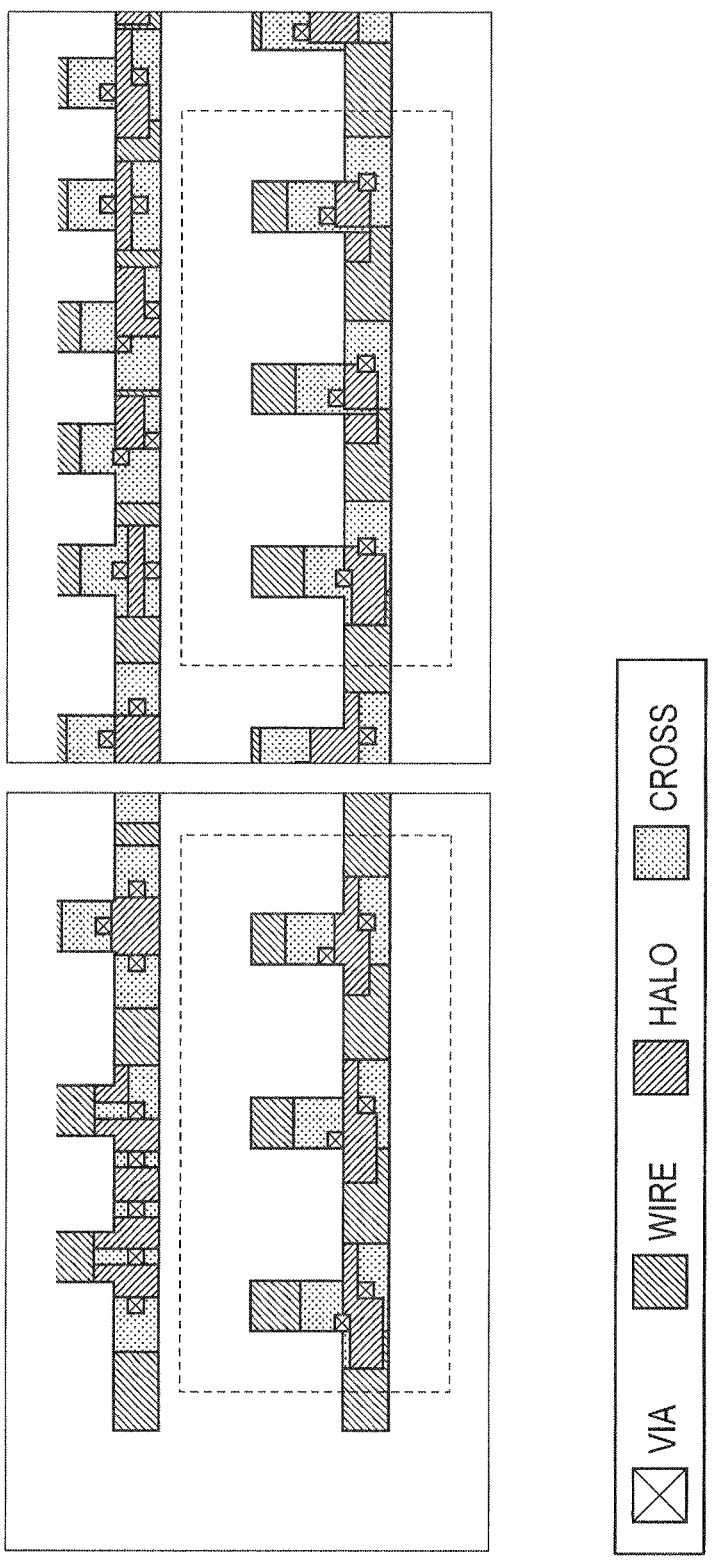
FIGS. 17A and 17B are diagrams illustrating results of processing on the input layout information.

FIGS. 16A and 16B illustrate input layout examples. In these examples, two vias are arranged in each intersection of metals but the positions of the vias differ from intersection to intersection. Each portion surrounded by a dashed line is to be verified. FIGS. 17A and 17B illustrate results of verification. FIG. 17A illustrates the result of verification on the case in FIG. 16A. FIG. 17B illustrates the result of verification on the case in FIG. 16B. The area of regions WIRE and HALO connected to each intersection CROSS and the ratio of the area of the region WIRE to the number of intersections CROSS are calculated. If there is a breach of the design rule, a portion corresponding to the breach is processed so as to be displayed, e.g., highlighted in addition to items displayed in FIGS. 17A and 17B.

Figure 18:
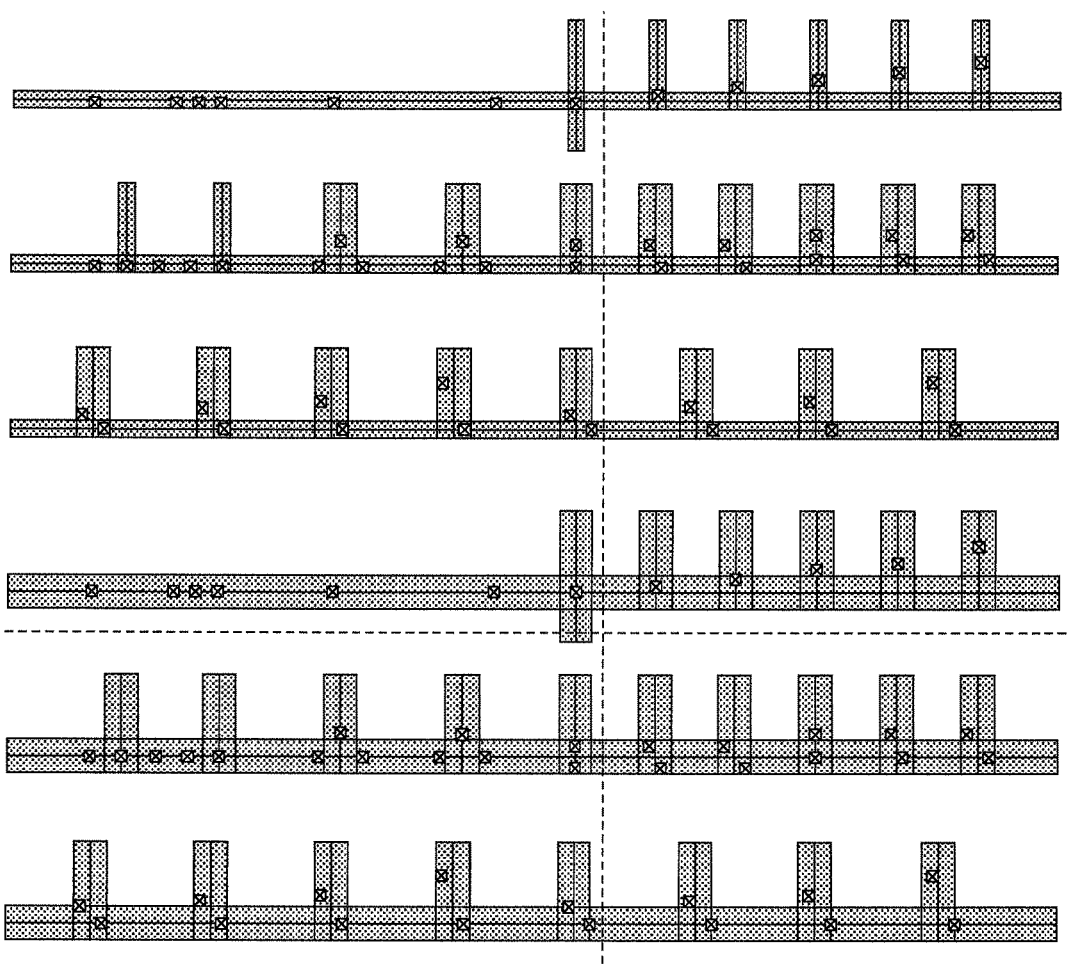
FIG. 18 is a diagram illustrating input layout information to be processed.
Figure 19:
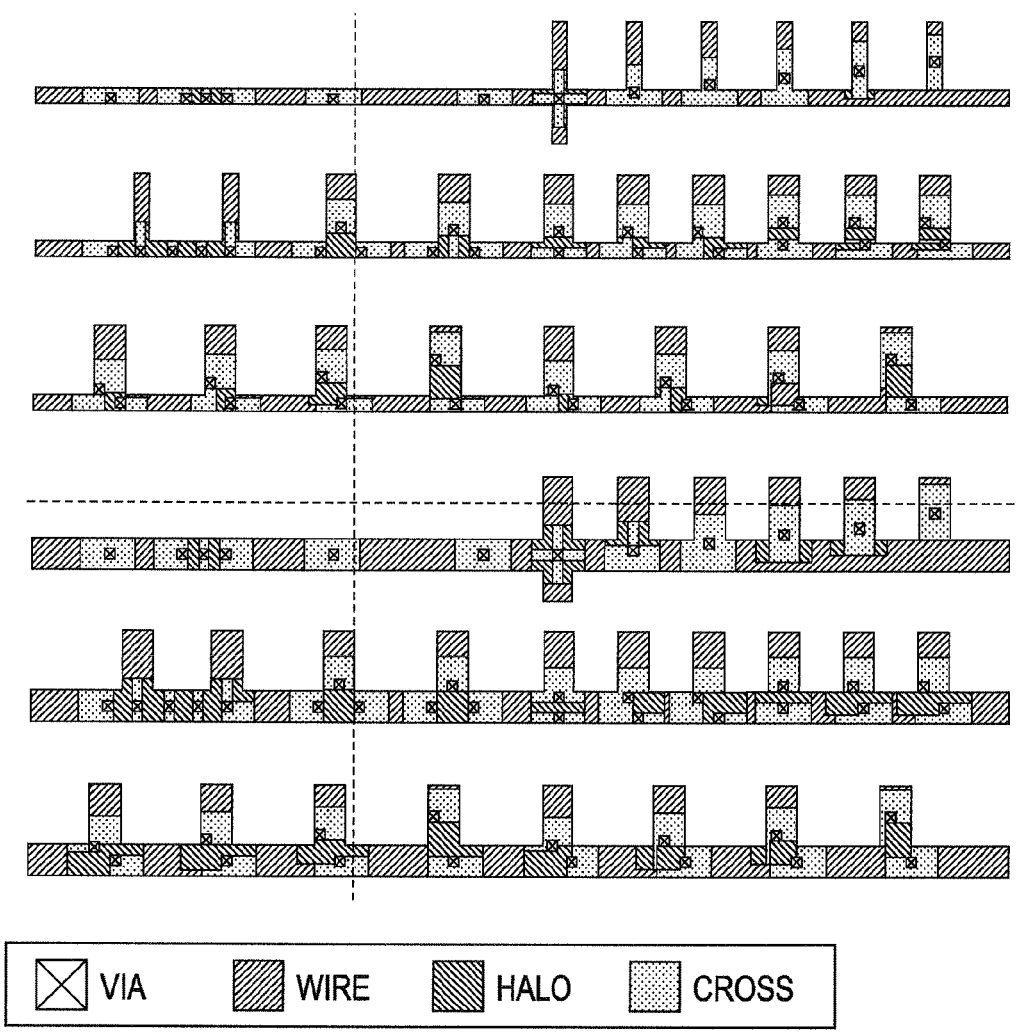
FIG. 19 is a diagram illustrating a result of processing on the input layout information.

FIG. 18 illustrates an input layout of a larger group of interconnects. FIG. 19 illustrates a result of verification on the layout of FIG. 18. As shown in FIG. 19, regions CROSS, WIRE, and HALO are set for respective vias. Various segmentations are achieved in consideration of the presence of an adjoining via and the positions of vias in a branch.

Figure 20:
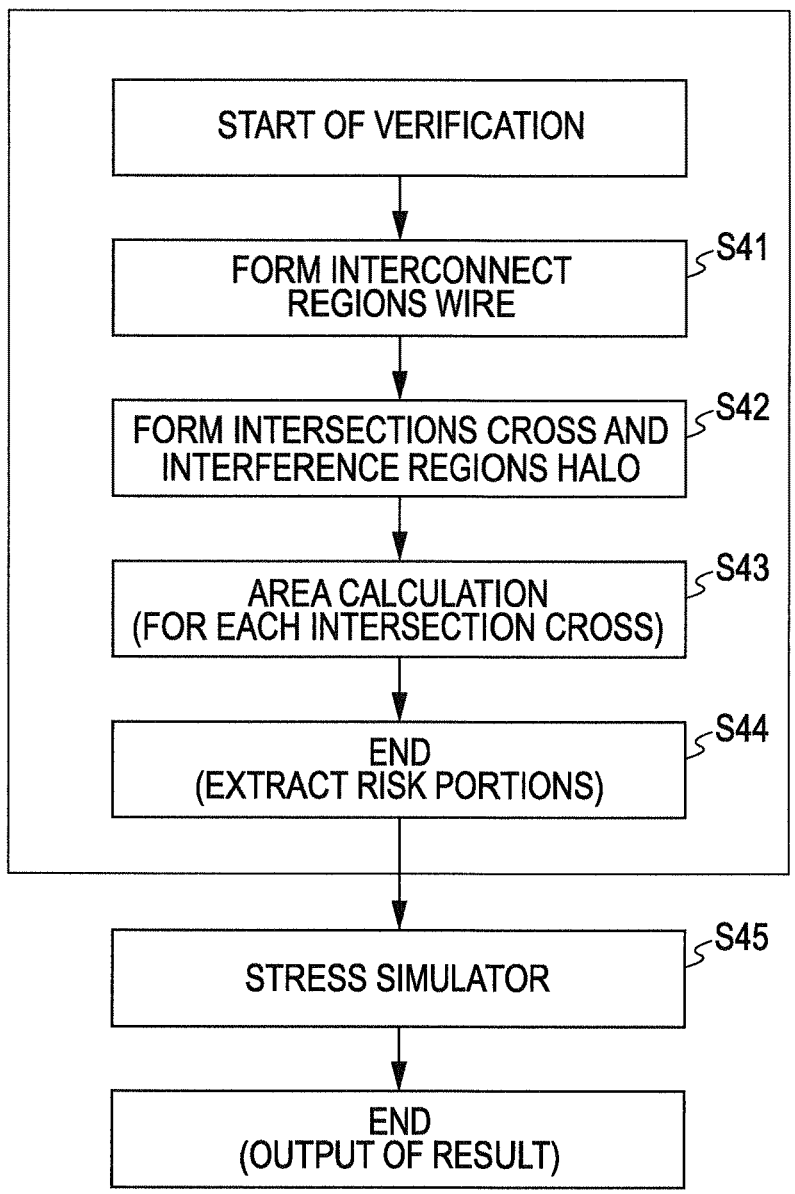
FIG. 20 is a diagram explaining a cooperative process by a stress simulator in accordance with the embodiment.

FIG. 20 is a diagram explaining a cooperative process by a stress simulator in accordance with the present embodiment.

When a user tries to perform chip-level stress simulation on all of layered interconnects and vias, it may be difficult to process enormous volumes of target data. The flow of verification in accordance with the present embodiment is used as pre-processing for the stress simulator. A result of verification in accordance with the present embodiment is given as information regarding risk portions to the stress simulator. Thus, detailed analysis can be selectively performed only on the risk portions for a short time.

Referring to FIG. 20, steps S40 to S45, corresponding to an operation in the present embodiment, serve as pre-processing of simulation by the stress simulator in step S45. In step S41, interconnect regions WIRE are formed. In step S42, intersections CROSS and interference regions HALO are formed. In step S43, area calculation based on a design rule is performed for each intersection CROSS. In step S44, portions each corresponding to a breach of the design rule are extracted as risk portions. Information regarding the risk portions which should be subjected to stress simulation in S45 is given to the stress simulator.

Figure 21:
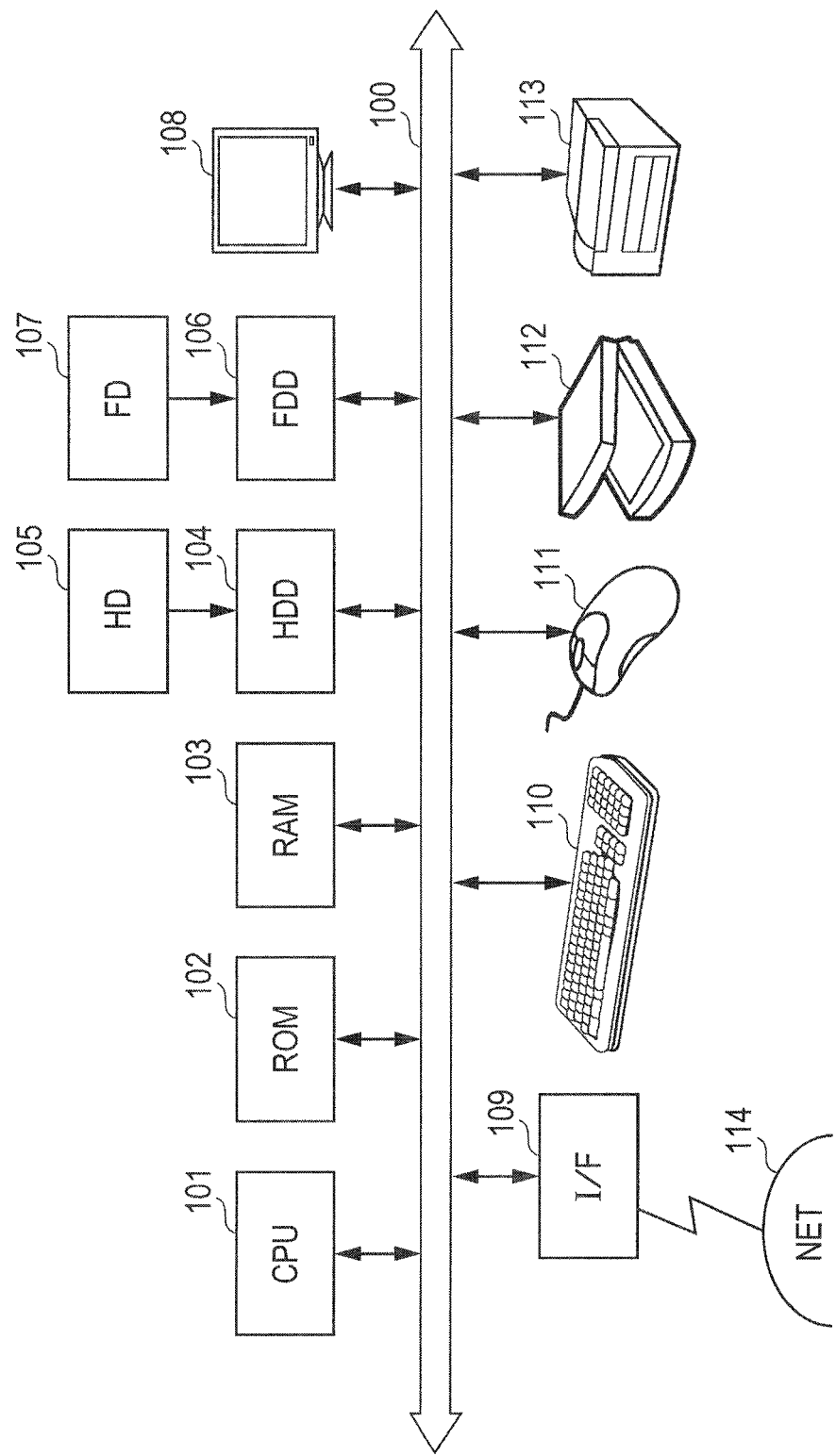
FIG. 21 is a diagram explaining the hardware configuration of a design verification apparatus in accordance with the embodiment.

FIG. 21 is a diagram explaining the hardware configuration of the design verification apparatus according to the present embodiment.

The design verification apparatus includes a central processing unit (CPU) 101, a read-only memory (ROM) 102, a random access memory (RAM) 103, a hard disk drive (HDD) 104, a hard disk (HD) 105, a flexible disk drive (FDD) 106, a flexible disk (FD) 107, which serves as an example of a removable recording medium and includes a compact disk read-only memory (CD-ROM) or a digital versatile disk (DVD)), a display 108, an interface (I/F) 109, a keyboard 110, a mouse 111, a scanner 112, and a printer 113. The components are connected to a bus 100.

The CPU 101 controls the whole of the design verification apparatus. The ROM 102 stores programs, such as a boot program. The RAM 103 is used as a work area for the CPU 101. The HDD 104 controls read and write of data from/to the HD 105 under the control of the CPU 101. The HD 105 stores written data under the control of the HDD 104.

The FDD 106 controls read and write of data from/to the FD 107 under the control of the CPU 101. The FD 107 stores written data under the control of the FDD 106 and allows the design verification apparatus to read data stored in the FD 107. Each of the HD 105 and the FD 107 is one of a storage which stores the layout information of the semiconductor device.

In addition to the FD 107, a CD-ROM, such as a compact disk readable (CD-R) or a compact disk rewritable (CD-RW), a magneto-optical (MO) disk, a DVD, or a memory card, can be used as a removable recording medium. The display 108 displays a cursor, an icon, a tool box, and data indicating text, images, and functional information. As for the display 108, for example, a cathode ray tube (CRT), a thin film transistor (TFT) liquid crystal display, or a plasma display can be used.

The I/F 109 is connected to a network 114, such as the Internet, through a communication line and is further connected to another apparatus through the network 114. The I/F 109 interfaces between the network 114 and the components included in the design verification apparatus to control input and output of data from/to an external apparatus. As for the I/F 109, for example, a modem or a LAN adapter can be used.

The keyboard 110 includes keys for inputting characters, numerals, and various instructions to input data. The keyboard 110 may be a touch panel input pad or a ten-key pad. The mouse 111 is used to move the cursor, select a range, move a window, change the size of a window, and the like. Another pointing device having the same functions as those of the mouse 111, for example, a track ball or a joystick may be used.

The scanner 112 optically reads an image to capture image data into the design verification apparatus. The scanner 112 may have an optical character reader (OCR) function. The printer 113 prints an image and/or text based on data. As for the printer 113, for example, a laser printer or an ink jet printer can be used.

Figure 22:
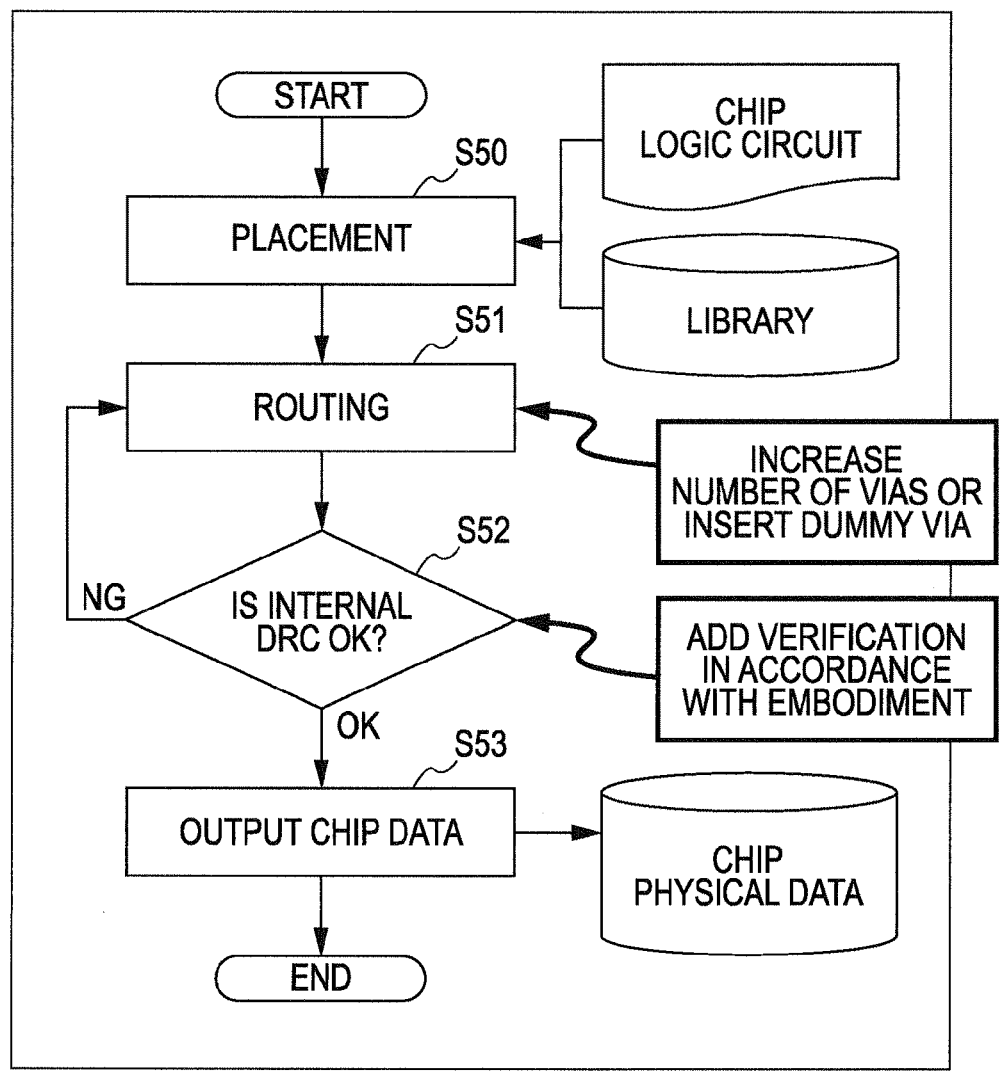
FIG. 22 is a diagram illustrating a way of applying a method for verification in accordance with the embodiment to designing of a semiconductor device.
Figure 23:
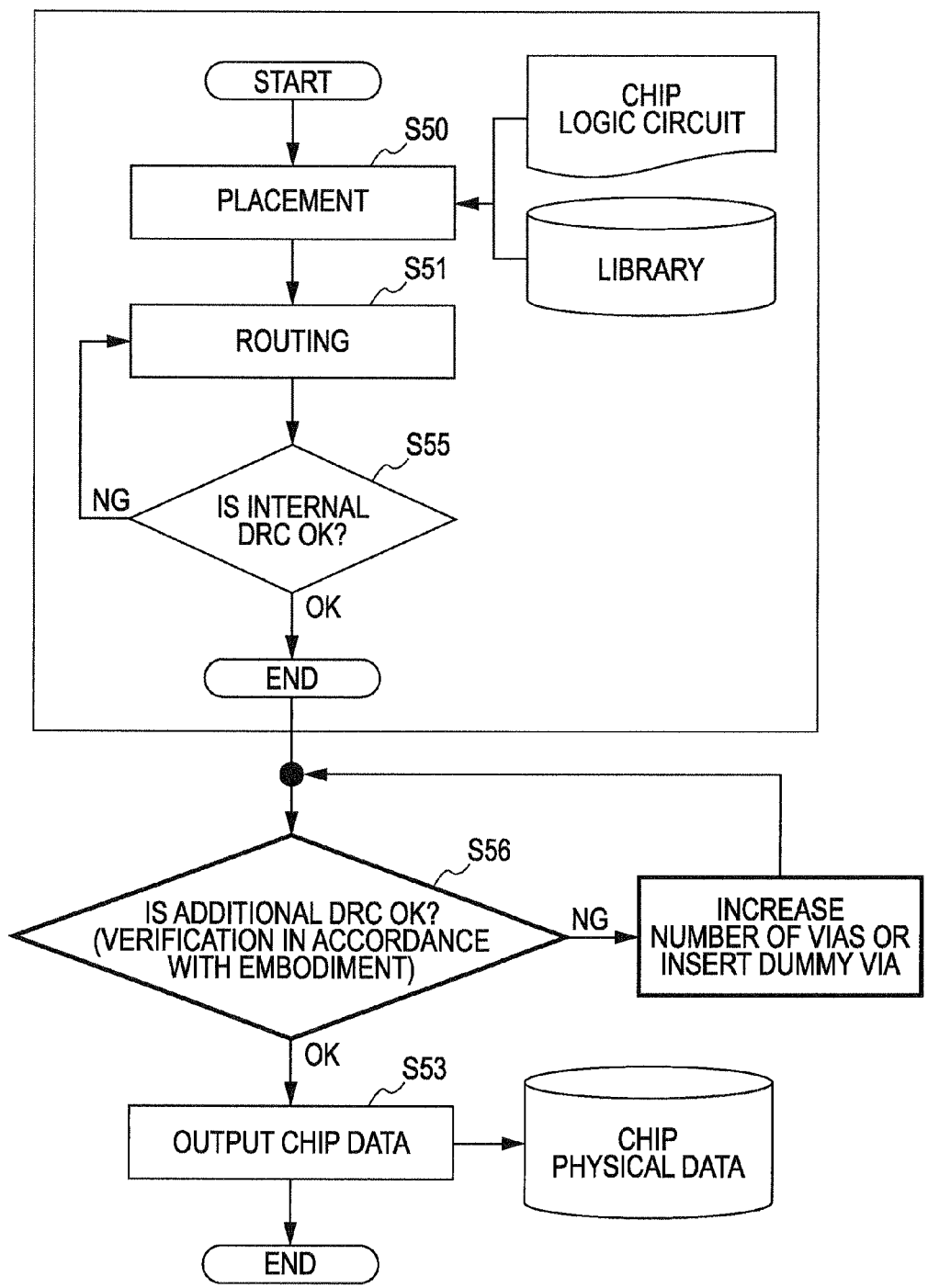
FIG. 23 is a diagram illustrating another way of applying the method for verification in accordance with the embodiment to designing of a semiconductor device.

FIGS. 22 and 23 illustrate a way of applying a method for verification in accordance with the present embodiment to designing of a semiconductor device.

FIG. 22 is a diagram illustrating a flow of standard placement and routing.

In step S50, the layout information is acquired from a chip logic circuit and an element library and elements are placed on a chip. In step S51, routing is performed. At that time, the number of vias is increased or a dummy via is inserted. In step S52, internal design rule check (DRC) for the chip is performed. If there is a breach of a design rule, the process returns to step S51 and routing is reset. If the design rule check is OK, chip data is output as chip physical data in step S53. The process is then terminated. The design rule is determined before the start of designing and is automatically applied to the layout of a chip subjected to automatic placement and routing. Until the design rule is satisfied, a design apparatus repeats replacement of elements and rerouting.

There is a flow in which the design rule check (DRC) is performed simultaneously with or after routing, and if a breach of the design rule is detected, rerouting is performed. The method for verification in the present embodiment is incorporated into the DRC, so that appropriate via insertion without causing a disconnection defect due to stress migration can be achieved without remarkably changing the existing flow of placement and routing. As for the via insertion, any of a process of increasing the number of vias and a process of inserting a dummy via may be performed. Alternatively, either of the increasing process and the inserting process can be preferentially performed in accordance with user setting.

FIG. 23 illustrates another way of applying the method for verification in the present embodiment to designing of a semiconductor device.

FIG. 23 is a diagram illustrating a flow in which via insertion is performed as post-processing after the existing process of placement and routing. Referring to FIG. 23, the same processing steps as those in FIG. 22 are designated by the same reference numerals and detail description thereof is omitted. Internal DRC in step S55 does not include the method for verification in the present embodiment. The method for verification in the present embodiment is applied to DRC in step S56. If it is determined in step S56 that the additional DRC is NG, increasing the number of vias or via insertion is repeated until it is determined in step S56 that the DRC is OK. If it is determined in step S56 that the DRC is OK, chip data is output as chip physical data and the designing is then terminated.

After placement and routing, the verification in the present embodiment is performed. If a breach of the design rule is detected, via insertion is performed. According to the method, appropriate via insertion without causing a disconnection defect due to stress migration can be performed as external processing without depending on a placement and routing tool. As for the via insertion, any of the process of increasing the number of vias and the process of inserting a dummy via may be performed. Alternatively, either of the increasing process and the inserting process can be preferentially performed in accordance with user setting.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A design verification apparatus for a semiconductor device, comprising:
    a storage for storing layout information of the semiconductor device, the layout information including information of interconnection regions and via regions; and
    a controller for oversizing each of the via regions by a determined value, and for dividing the interconnection regions into wire regions and cross regions,
    the cross regions corresponding to overlapping regions of the interconnection regions and the oversized via regions,
    the wire regions excluding the cross regions and extending between the cross regions, and
    the controller extracting at least one of the wire regions as a candidate having a potential risk of future disconnection defect on the basis of the length of the wire regions.

2. The design verification apparatus of claim 1, wherein the controller decides borders of the wire regions and the cross regions, the borders being made by the enlarged via regions.

3. The design verification apparatus of claim 1, wherein the controller extracts at least one of the wire regions as the candidate having the potential risk on the basis of total length of the wire regions connected to the cross region.

4. The design verification apparatus of claim 1, wherein the controller extracts at least one of the wire regions on the basis of total area of the wire regions connected to the cross region, the area being a product of the total length of the wire regions and width of the wire region.

5. The design verification apparatus of claim 1, wherein the controller extracts at least one of the wire regions on the basis of the ratio of the area of the wire region to number of cross regions connected to the wire region.

6. A design verification method for a semiconductor device, comprising:
    storing layout information of the semiconductor device, the layout information including information of interconnection regions and via regions;
    oversizing each of the via regions by a determined value;
    dividing the interconnection regions into wire regions and cross regions,
    the cross regions corresponding to overlapping regions of the interconnection regions and the oversized via regions,
    the wire regions excluding the cross regions and extending between the cross regions; and
    extracting, using a microprocessor, at least one of the wire regions as a candidate having a potential risk of future disconnection defect on the basis of the length of the wire regions.

7. The design verification method of claim 6, further comprising, deciding borders of the wire regions and the cross regions, the borders being made by the enlarged via regions.

8. The design verification method of claim 6, further comprising extracting at least one of the wire regions as the candidate having the potential risk on the basis of total length of the wire regions connected to the cross region.

* * * * *